(12) United States Patent
Rezeq (10) Patent No.: US 8,460,049 B2
(45) Date of Patent: Jun. 11, 2013

(54) FABRICATION OF SUPER ION—ELECTRON SOURCE AND NANOPROBE BY LOCAL ELECTRON BOMBARDMENT

(75) Inventor: Moh'd Rezeq, Abu Dhabi (AE)

(73) Assignee: Khalifa University of Science and Technology & Research (Kustar), Abu Dhabi (AE)

( * ) Notice: Subject to any disclaimer, the term of this patent is extended or adjusted under 35 U.S.C. 154(b) by 78 days.

(21) Appl. No.: 13/293,167

(22) Filed: Nov. 10, 2011

(65) Prior Publication Data

US 2013/0122774 A1    May 16, 2013

(51) Int. Cl.
*H01J 9/12*    (2006.01)
(52) U.S. Cl.
USPC ............................................. 445/49; 445/50
(58) Field of Classification Search
USPC ......... 445/46, 49–50; 313/275–279, 271–273
See application file for complete search history.

(56) References Cited

U.S. PATENT DOCUMENTS

| | | | | |
|---|---|---|---|---|
| 3,763,346 A | * | 10/1973 | Drechsler et al. | 219/121.35 |
| 7,064,477 B2 | * | 6/2006 | Magera et al. | 313/336 |
| 7,176,610 B2 | * | 2/2007 | Katsap | 313/311 |

* cited by examiner

*Primary Examiner* — Anne Hines
(74) *Attorney, Agent, or Firm* — Renner, Otto, Boisselle & Sklar, LLP (57) ABSTRACT

Method of fabricating super nano ion-electron source including: placing an assembly of precursor tip and metal ring around the precursor tip below the apex in a FIM chamber; applying dc current from grounded source to the metal ring to heat the ring; gradually applying high voltage to the precursor tip; wherein the metal ring is exposed to a high electric field from the tip, generating Schottky field emission of electrons from the metal ring, the applied electrical field sufficient to cause electrons to be extracted from the metal ring and accelerated to the shank with energy sufficient to dislodge atoms from the shank; and monitoring the evolution of the tip apex due to movement of dislodged atoms from the shank to the apex while adjusting the electrical field, the current or temperature of the metal ring until the apex forms a sharp nanotip with an atomic scale apex.

23 Claims, 6 Drawing Sheets

FABRICATION OF SUPER ION—ELECTRON SOURCE AND NANOPROBE BY LOCAL ELECTRON BOMBARDMENT

FIELD OF THE INVENTION

This invention relates to the field of nanotechnology, and in particular to the fabrication of nanotips with an atomic scale apex that can be used as a super source of electron or ion beams and as a nano-probe in scanning probe microscopes.

BACKGROUND OF THE INVENTION

Nanotips have crucial applications in nanotechnology, particularly in scanning probe microscopy and electron microscopy. Therefore, several methods have been developed to fabricate ultra sharp tips [1-5]. These methods can be summarized as: The surface diffusion of atoms by heating the entire tip under an electric field [1,4]; Surface reconstruction and facet formation of pyramidal tip apex by thermal treatment [2]; The deposition of external metal atoms on the tip apex surface [3]; Field assisted nitrogen etching of tungsten tips [5]. All of these methods have exhibited a very sharp end that might terminate with a single atom, as observed in the field ion microscope (FIM). Interestingly, the last atom forms an atomic channel of electrons in the field emission mode which results in a self collimated and coherent electron beam with an outstanding brightness [1,2,6,7]. Nanotips having a single atom tip are ideal for low energy holographic microscopy, and would enable characterization of biological molecules or fragile nano structures with no damage. Nanotips with a well defined shape and atomic scale are crucial for manipulating and characterizing molecules and nano objects in the scanning probe microscope. Furthermore, in a multi-probe scanning probe microscope (SPM), multiple probes are needed to be brought into close vicinity to form physical contacts with a nano object to perform electrical measurements. However, the distance between these probes is limited by the tip size and shape at a mesoscopic scale. These tips are usually characterized in the field ion microscope (FIM) and field emission microscope (FEM) where only the apex structure can be imaged and characterized. The analytical and finite element analyses have shown that, although these tips have a similar apex, they are different and are not really sharp at a mesoscopic scale [8].

Other problems inherent in the previous methods for nanotip fabrication include:

The treatments of these methods are restricted to the very end of the tip, thus resulting in nanotips with a quite small aspect ratio.

These methods, except the nitrogen etching method disclosed in U.S. Pat. No. 7,431,856 B2, only apply to certain metal tips with particular crystal orientation, e.g., W(111) or Ir(121).

All of these methods, except the nitrogen etching method, are blind methods, since the process is unmonitored, and this can result in very poor control of the shape of the produced nanotip.

The nitrogen etching method of U.S. Pat. No. 7,431,856 B2 doesn't work with reactive gases that have an ionization field in the range or less than the evaporation field of the metal; for example, nitrogen etching doesn't work with Ir metal tips.

The nitrogen etching method produces nanotips that are contaminated with the etchant gas species and other contaminants that may accompany the dosed nitrogen gas.

Due to these various problems, a need remains for improved methods of forming nanotips having controllably very sharp, clean nanotips that terminate with an apex of atomic scale or a single atom and apply to a wide range of metals and semiconductors.

SUMMARY OF THE INVENTION

In accordance with the present invention, a new method is provided for formation of extremely sharp and clean nanotips that terminate with an apex of atomic scale or a single atom. Such nanotips can be used as, e.g. super ion and electron sources and nano probes for SPM machines. Thus, embodiments of the present invention provide a solution to all of the foregoing problems. The method of the present invention depends on locally bombarding the nanotip shank by electrons that are guided and accelerated by the nanotip electric field towards the shank. These electrons will be extracted from a nearby source, such as the hot wire ring which is detailed below. Upon collision of these electrons with the surface atoms, a substantial energy from electrons will be deposited into these atoms which in turn become mobile and move over the surface due to the field gradient. Once these mobile atoms reach the apex of the high field, some of them will be evaporated from the periphery of the apex and others will continue migrating until they form an extremely sharp end. Careful adjustment to the electric field and the temperature of the ring allow one to obtain an extremely sharp tip. This process is described in detail below and illustrated in the accompanying drawings.

Accordingly, in one embodiment, the present invention relates to a method of fabricating a nanotip comprising:

placing an assembly of precursor tip (with an apex and a shank) and a heating metal ring in a field ion microscope chamber;

placing the metal ring around the precursor tip along the shank at a level below the apex;

applying a direct current to the metal ring to heat the ring;

applying an electrical field to the precursor tip in the field ion microscope;

wherein the metal ring is exposed to a high electric field from the tip, leading to generation of Schottky field emission of electrons from the metal ring, wherein the applied electrical field is sufficient to cause the electrons to be extracted and then accelerated from the metal ring to strike the shank with an energy sufficient to dislodge atoms from the shank; and monitoring the evolution of the tip apex due to movement of dislodged atoms from the shank to the apex while adjusting the electrical field and adjusting the current and temperature of the metal ring until the apex is sharpened to form a nanotip with a desired apex atomic structure.

In one embodiment, the method further comprises applying an electric field to the precursor tip to remove contaminant species and defects prior to connecting the metal ring to the current source, and hence prior to tip sharpening process.

In one embodiment, the precursor tip comprises a metal or a doped semiconductor.

In one embodiment, the precursor tip is prepared by placing a wire in a vacuum chamber. In one embodiment, the wire comprises an electrochemically etched polycrystalline or single crystal wire. In one embodiment, the vacuum chamber is an ultra high vacuum chamber. In one embodiment, a positive voltage is gradually applied to the tip of the wire to remove an oxide layer and other contaminants.

In one embodiment, the metal ring is made from a refractory metal.

In one embodiment, the refractory metal comprises tungsten, niobium, molybdenum, tantalum, rhenium, osmium, iridium, or a combination or an alloy of two or more thereof.

In one embodiment, the metal ring is about 2-4 mm in diameter.

In one embodiment, the ring is placed behind the precursor tip apex by about 1 mm or more.

In one embodiment, the electric field on the precursor tip is generated by applying an electric voltage from 5 to 20 kV.

In one embodiment, the temperature of the metal ring is about 1800 K and is obtained by applying a direct current through the ring.

In one embodiment, the electric field on the ring results from the voltage applied to the precursor tip and connecting the ring to ground.

In one embodiment, the electric field on the apex of the precursor tip is directed toward a screen in the field ion microscope and the electric field on the shank of the precursor tip is directed toward the metal ring.

In one embodiment, the electric field on the ring is sufficient to generate Schottky field emission of electrons from the metal ring.

In one embodiment, a voltage difference between the precursor tip and the metal ring is sufficient to cause the excited electrons to be accelerated from the metal ring to strike the shank with energy of about 10 keV or more, thereby to dislodge atoms from the tip shank.

In one embodiment, a large resistance (e.g., a few hundred mega ohms) between the high voltage source and the tip is provided to avoid arcing or sparking between the precursor tip and the metal ring.

Benefits of the present invention may include one or more of the following. The method works with all metals and is not restricted to a specific metal. The method is generally applicable to both crystalline, polycrystalline or amorphous metals and semiconductors. The method provides a highly symmetric tip. The method provides a high aspect ratio tip. The method provides a nanotip that is quite clean since no etchant gases or other possible contaminants are used in the process. The method is applicable to doped semiconductor materials, which makes it vital for nano semiconductor devices.

Thus, as described herein, the present invention provides a novel method for preparing a nanotip having a high aspect ratio and an extremely sharp end terminating in a single atom, in which no etchant gas is used in the process and in which the nanotip thus formed can be longer than the precursor tip from which it was made. More importantly, the physical mechanism of fully controlled local electron bombardment make this process applicable to any kind of metal and doped semiconductors.

Additional details which can be readily appreciated by those of skills in the art are provided in the following.

BRIEF DESCRIPTION OF THE DRAWINGS

FIGS. 8(*a*) and (*b*) are schematic two-dimensional depictions of nanotips made in accordance with embodiments of the present invention shown in exemplary end uses.

It is noted that the sizes of elements shown in the drawings, including electrons, ions and tip atoms, are not to scale.

Furthermore, it should be appreciated that the process steps and structures described below do not form a complete process flow for manufacturing the nanotips described herein. The present invention can be practiced in conjunction with fabrication techniques currently used in the art, and only so much of the commonly practiced process steps are included as are necessary for an understanding of the present invention.

DETAILED DESCRIPTION

Figure 1:
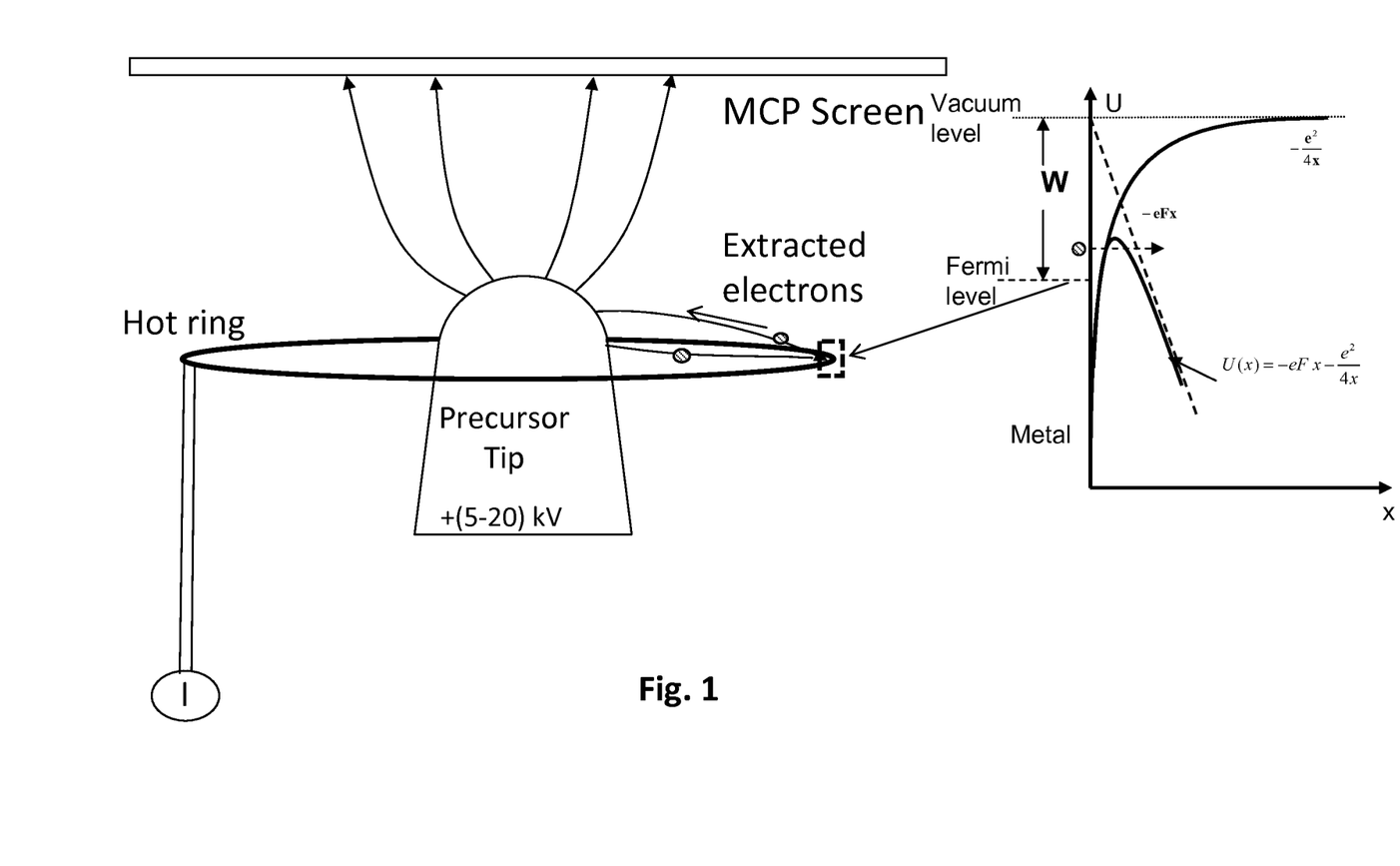
FIG. 1 is a schematic depiction of an arrangement of the elements of an apparatus for carrying out a method in accordance with embodiments of the present invention, and includes a Schottky field emission graph.
Figure 2:
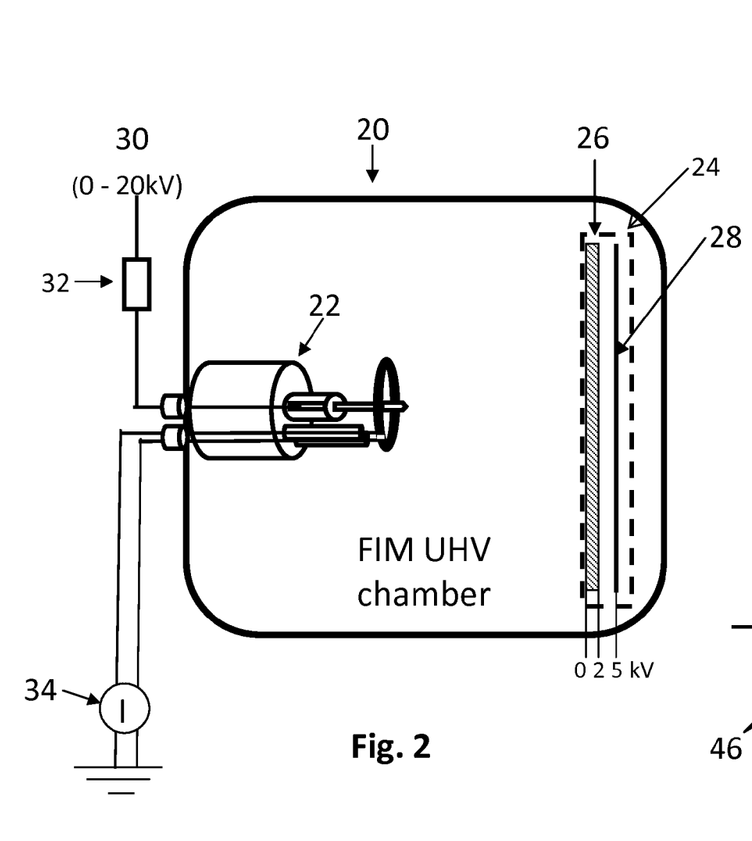
FIG. 2 is a schematic depiction of a typical field ion microscope chamber as arranged in accordance with an embodiment of the present invention.
Figure 3:
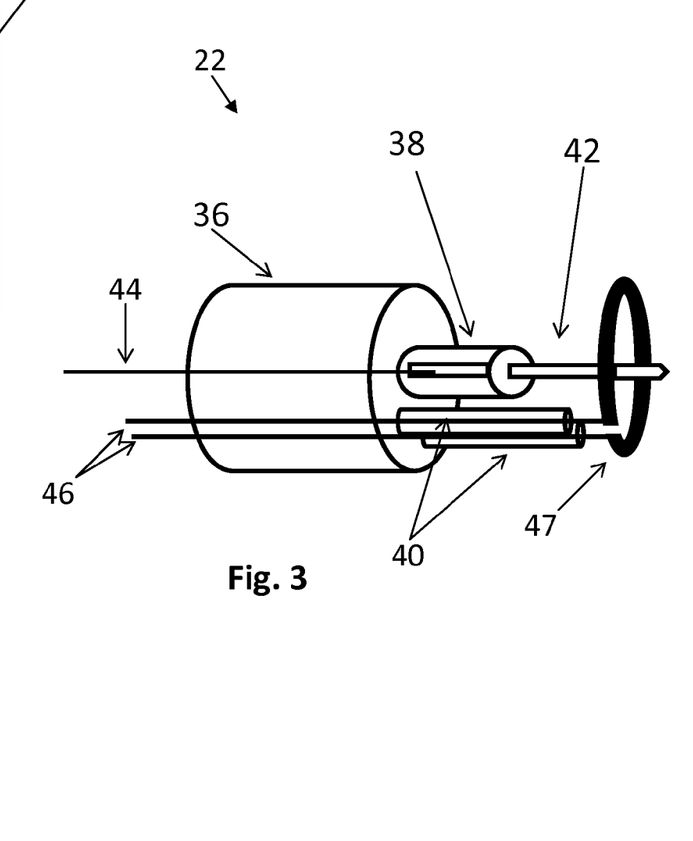
FIG. 3 is a schematic depiction of an ion and electron source assembly for use in accordance with embodiments of the present invention.
Figure 4:
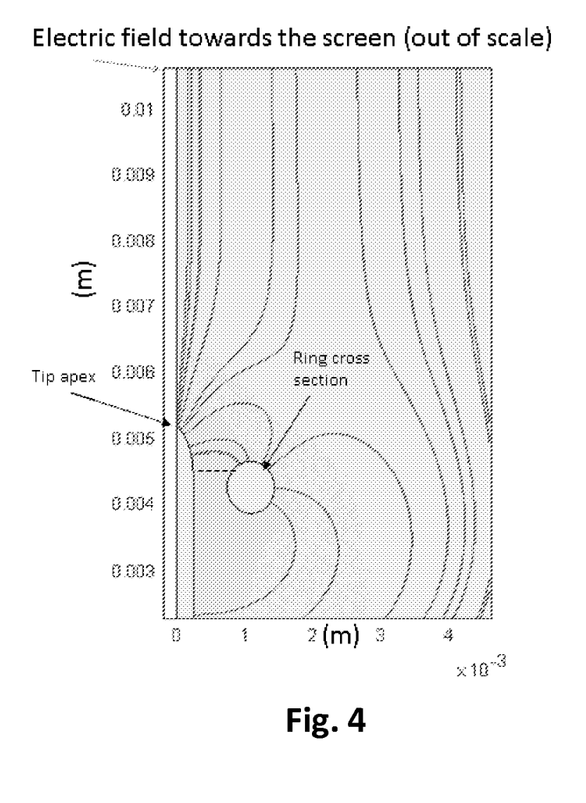
FIG. 4 is a finite element simulation showing the electric field distribution on a tip apex and along a shank of a precursor tip, in accordance with an embodiment of the present invention.
Figure 5:
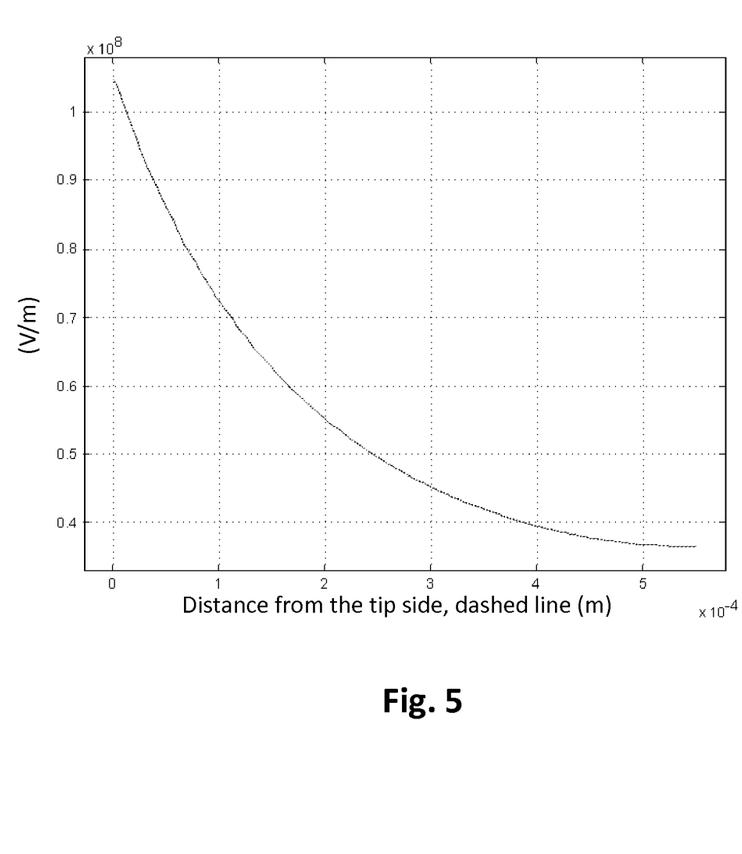
FIG. 5 is a graph depicting an electric field profile along a straight line between the metal ring and the precursor tip, as shown in FIG. 4.

In accordance with the present invention, a new method is provided for formation of extremely sharp nanotips, which can be used as, e.g., ideal ion and electron sources and nano probes for scanning probe microscopes. This new approach for fabricating extremely sharp nanotips relies on locally and intentionally bombarding the nanotip shank by high energy electrons, while the nanotip apex is protected. This can be achieved by placing a metal ring of a radius 2-4 mm from a refractory metal, such as tungsten, around the precursor tip. The ring is placed behind the precursor tip apex by about 1 mm or more, as depicted in FIGS. 1-3. When the precursor tip of a nominal radius of 50 nm (such precursor tips can be readily fabricated by the conventional electrochemical etching method) is connected to a high positive voltage around 5-20 kV, the field at the tip apex will be high enough to generate helium ions from the helium gas which is previously introduced in the ultra high vacuum chamber of the field ion microscope (FIM) for imaging, as in FIGS. 1-2. Because the ring is only 1-2 mm away from the tip, the electric field on the ring itself will be in the order of $1 \times 10^7$ V/m. The electric field distribution on the precursor tip apex and the ring is depicted in the schematic in FIG. 1 and by the finite element simulation in FIG. 4. The simulations in FIG. 4 shows that the electric field lines from the tip apex are directed toward the FIM screen, while the field lines from the shank are directed toward the ring. FIG. 5 shows the electric values ($3-11 \times 10^7$ V/m) along the straight line between the tip shank and the ring, as shown in the dashed line in FIG. 4.

The high tip voltage produces a high electric field at the tip apex which is adequate (approximately 5 Volt/Angstrom) for imaging the apex at atomic scale in the field ion microscope (FIM) by ionizing helium atoms. The initial tip is first cleaned in the FIM to remove defects and contaminations by the conventional field evaporation method, i.e. by slightly increasing the tip apex field and then reducing it to the imaging threshold value when the cleaning process is complete.

When the metal ring is heated by a direct current to around 1800 K, the free electrons in the metal will be elevated from their room temperature Fermi level, to a point at which the electric field on the ring is adequate to extract these electrons, i.e. Schottky field emission, and accelerate them toward the tip along the electric field lines, which as shown are directed to the tip shank. Unlike the conventional electron bombardment in which electrons are generated randomly by thermionic emission at a much higher temperature, the electrons in the present invention are generated by the Schottky field emission as illustrated in FIG. 1, where the field emission current density J(F, T, W) is given by the following equation:

$$J(F, T, W) = A_R T^2 e - \frac{(W - \Delta W)}{kT}, \text{ where } \Delta W = \sqrt{\frac{e^2 F}{4\pi \epsilon_o}} \quad [9]$$

where T is the ring temperature, F is the electric field at the ring, $\Delta W$ is the decrease in the surface barrier, e is the electron charge, $\epsilon_o$ is the vacuum permittivity and $A_R$ is the effective Richardson constant parameter, in the order of $1.0 \times 10^6$ A m$^{-2}$ K$^{-2}$.

Thus the extracted electron will be guided and accelerated by the electric field between the precursor tip and the ring. This allows a full control of the amount of electrons and the direction where electrons hit, by adjusting the ring temperature and positions and the electric field between the ring and the precursor tip.

Figure 6:
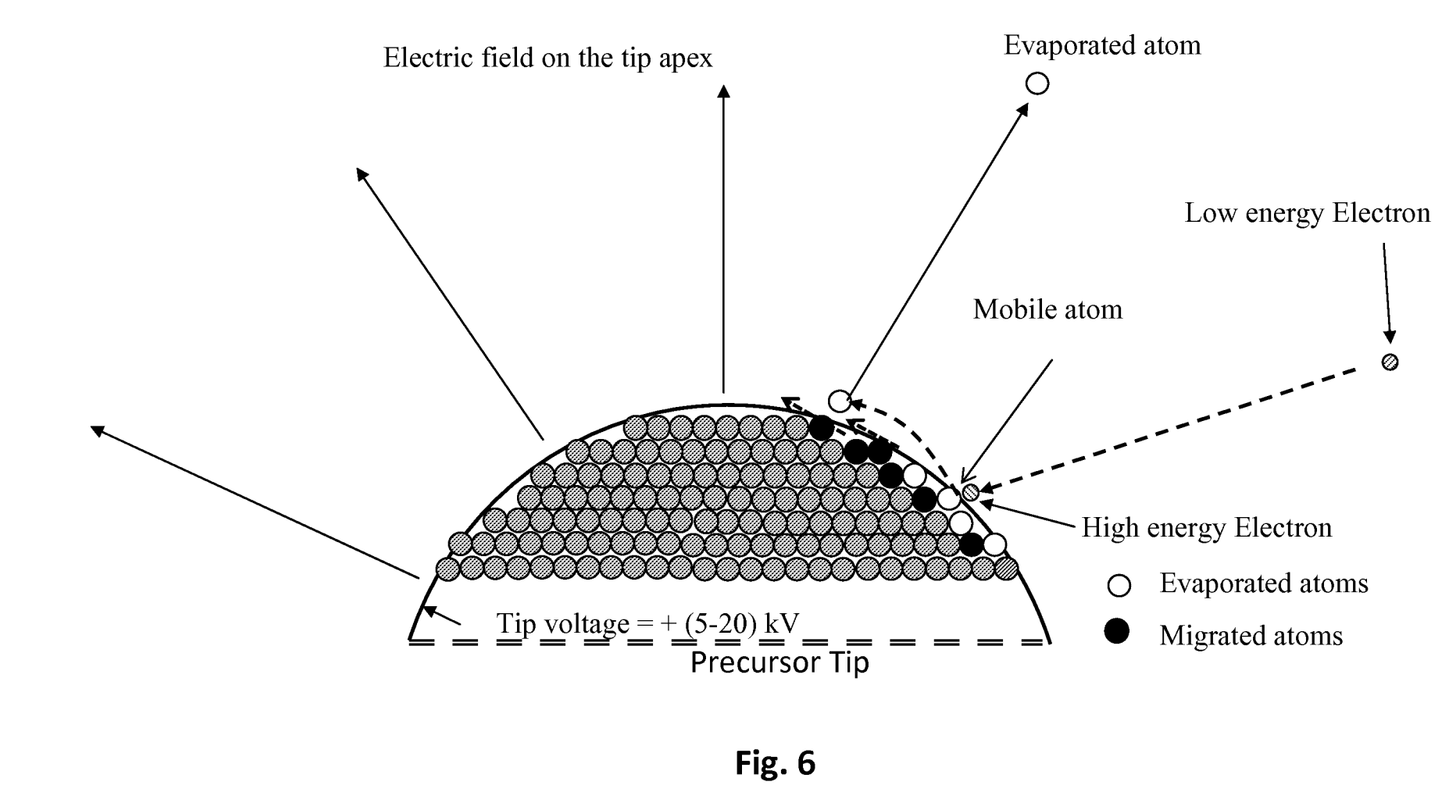
FIG. 6 is a schematic two-dimensional depiction of a precursor tip at the initial stages of a process in accordance with an embodiment of the present invention.
Figure 7:
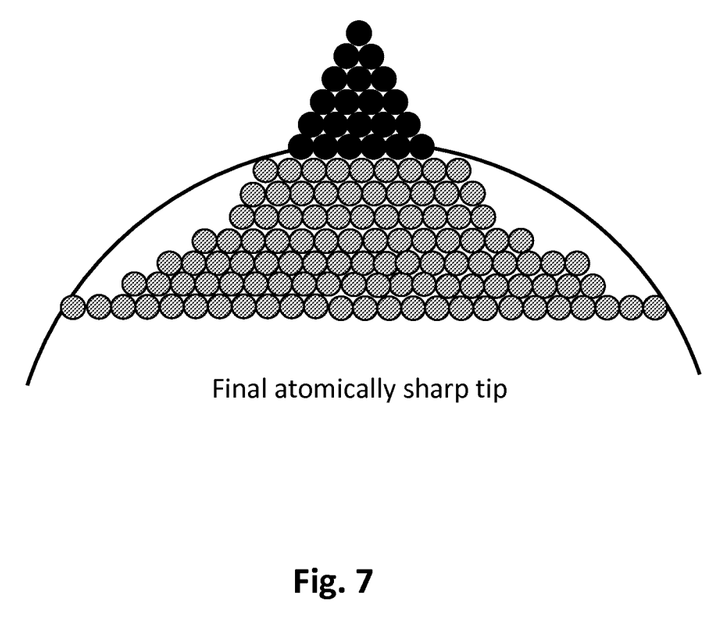
FIG. 7 is a schematic two-dimensional depiction of a nanotip made in accordance with an embodiment of the present invention.

On the precursor tip, shown in FIG. 6, the accelerated electrons will hit the tip shank at a high energy, >10 keV, and deposit substantial kinetic and thermal energy in the surface atoms, in that region. As a result, these atoms become mobilized and susceptible to move and migrate, due to the field gradient on the precursor tip, to the tip end. However, as these atoms get close to the tip apex the electric field gets higher as well. As a result the mobile atoms undergo two possible movements: In a first scenario, atoms with high enough energy and very weakly bound to the surface will be evaporated away from the periphery of the tip apex. In a second scenario, the atoms with less energy and a stronger tie to the surface will continue moving along the electric gradient toward the apex and build up on each other to form a conical or pyramid-like, extremely sharp apex, as shown in FIG. 7, which shows the tip end as a triangle shape in 2 dimensions, which is actually in three-dimensions is conical or pyramidal.

The apex evolution, from precursor tip to final nanotip with the desired tip apex, can be completely monitored in the field ion microscope, which allows adjustment of the electric field on the tip apex by adjusting the tip voltage and the metal ring temperature until the desired tip apex shape is attained.

To protect the ring and the tip from sparking or arcing due to the high voltages, a high resistance, e.g., about 100 MΩ is applied between the tip and the voltage source.

As noted above, two processes occur to shape the final nanotip. First, the evaporated atoms result in sharpening or reducing the tip base. Second, the migrated atoms result in even sharper extension, i.e. elongating the tip. Therefore the final nanotip extends higher (i.e., is longer) than the initial precursor tip apex. This is in contrast to the nitrogen etching process disclosed U.S. Pat. No. 7,431,856 B2, where the final nanotip is located below the initial tip apex.

As the resultant nanotip according to the present invention terminates with a single atom, such tips are ideal for use as, e.g., electron or ion sources for low energy electron microscopy or for high resolution ion and electron lithography. Furthermore, the high aspect ratio of these tips that result from the nature of this novel process, will allow bringing multiple tips in close vicinity for forming multiple probe contacts with nano or atomic size objects.

Finally, since this technique depends only on physical processes and no chemical reactions are involved, this means it can be readily applied to any metal or semiconductor materials of any crystal structure to fabricate nanotips for various applications in nanotechnology.

As only electrons are used in this process and no etching gasses or plasma that interfere in the structure of the tip are involved, this make it a very clean process and the produced nanotip is quite clean from any impurities.

The larger field present at the very small apex leads to continuing migration of atoms to the end and to form even sharper tips. However, after the formation the single atom, when further the metal tip atoms reach the single atom apex will be subsequently ionized and evaporated from that atomic site resulting in a highly focused ion beam. To stop evaporation of atoms from the apex the applied voltage tip has to be reduced.

In one embodiment, a damaged or dulled nanotip can be readily restored in situ by use of the method of the present invention. One simply sets the field-ring temperature parameters appropriately. This can also be done either in FIM mode or blindly (without imaging) by just monitoring the ion current and tip voltage. This provides a benefit when the nanotip is used in electron and ion microscopes as a source of electrons or ions, which usually results in some damage, dulling or other undesirable morphological changes to the nanotip.

The precursor tip can be made out of tungsten wire by electrochemical etching, and the metal ring can be tungsten. The invention is not however restricted to tungsten/tungsten combinations. It is predicted that a very wide range of materials could be treated in the same or similar way to fabricate nanotips. It is believed that almost any metal and alloys of metals or doped semiconductors will work as a precursor tip.

In addition to the previously mentioned crucial applications of the nanotips, made by the process in accordance with the present invention, in scanning probe microscopes (STM and AFM) and as a super electron source in electron microscopes (SEM and TEM and low energy electron holography) they have more interesting applications. Such extremely sharp nanotips are highly needed for nano lithography in Focused Ion Beam (FIB), for electron lithography, for atomic lithography in STM. Nanotips made of magnetic material may also have uses in data storage applications. Other applications such as experiments involving probe atomic contacts with various nano-materials or alloys and molecules are feasible with such nanotips.

In one embodiment, the precursor tip is made of a metal or a semiconductor. In one embodiment, the metal comprises tungsten, niobium, molybdenum, tantalum, rhenium, osmium, iridium, palladium, gold and other metals, or an alloy of two or more thereof. In one embodiment, the metal comprises tungsten. The metal may be any metal suitable for use as a tip for AFM or for other nanoprobes known in the art.

In one embodiment, the metal ring is made of a refractory metal, in which the refractory metal comprises tungsten, niobium, molybdenum, tantalum, rhenium, osmium, iridium, or a combination or an alloy of two or more thereof. In one embodiment, the metal of the metal ring is the same as the metal of the precursor tip, but is not necessarily the same.

As shown in FIGS. 1-3, the precursor tip is placed in the front of the FIM screen and the ring is placed behind the tip end. The electric field lines from the tip apex are directed toward the screen, while the field lines from the shank are directed toward the ring. In accordance with embodiments of the invention FIG. 1 also shows the energy diagram for a hot electron in the metal under the high electric field. The electron has enough energy to tunnel through the reduced barrier by the electric field, and this is the Schottky field emission.

FIG. 1 is a schematic depiction of an arrangement of the elements of an apparatus for carrying out a method in accordance with embodiments of the present invention, and includes a Schottky field emission energy diagram. As shown in FIG. 1, the initial precursor tip is placed in front of the FIM screen and the metal ring is placed behind the tip end, that is, lower on the precursor tip that the tip itself. As shown in FIG. 1, the electric field lines from the tip apex are directed towards the FIM screen, but the field lines from the shank are directed towards the metal ring. FIG. 1 graphically illustrates that the electric field lines from the precursor tip apex are directed towards the screen, while the electric field lines from the shank and shoulder of the shaft are directed towards the metal ring. The Schottky field emission energy diagram in the right-hand portion of FIG. 1 shows the energy for a hot electron in the metal under high electric field. Under these conditions, the electron has obtained enough energy under the influence of the electric field to tunnel through the reduced barrier.

FIG. 2 is a schematic depiction of typical field ion microscope (FIM) chamber showing the position of the ion-electron source assembly and its connections and the screen components. FIG. 2 is a schematic depiction of a typical field ion microscope chamber 20 arranged in accordance with an embodiment of the present invention. As shown in FIG. 2, the FIM chamber 20 encloses an ion-electron source assembly 22 and a FIM screen assembly 24, in an ultrahigh vacuum chamber. The FIM screen assembly 24 includes a microchannel pale (MCP) 26 and a phosphor screen 28. As further illustrated in FIG. 2, the ion-electron source assembly 22 includes an electrical connection to a high voltage source 30 (e.g., up to about 20 kV) with a protection resistor 32 interposed to prevent sparking or arcing across the gap between the metal ring and the precursor tip. The ion-electron source assembly 22 further includes an electrical connection to a DC current source 34, which provides power to the metal ring.

FIG. 3 is a schematic depiction of an ion and electron source assembly 22 for use in accordance with embodiments of the present invention, similar to that shown in FIG. 2. As shown in FIG. 3, the ion and electron source assembly 22 includes a ceramic holder base 36, to which is attached a ceramic tip holder base 38 and a pair of ceramic ring wire holders 40. As shown in FIG. 3, the ion and electron source assembly 22 includes electrical connections to provide high voltage to the demountable precursor tip 42 via a high voltage wire 44, and to provide DC current via heating current wires 46 to the ring 47.

FIG. 4 is a finite element simulation showing the electric field distribution on the tip apex and along the shank. FIG. 4 is a side cross-sectional view of a precursor tip apex and a ring, and electric field lines at various distances (0 to about $4.5 \times 10^{-3}$ meter) laterally from the center of the precursor tip, and along distances from the base of the precursor tip towards the FIM chamber screen. As shown in FIG. 4, the field on the apex has the highest intensity and is directed toward the screen and the field down at the shank is directed toward the ring. The ring-tip model in 2D axial symmetry is represented by a half tip shape and a circle for the cross section of the ring. (b) The electric field profile (in the range of $10^7$ V/m) along the straight line between the tip and ring is depicted in FIG. 5.

FIG. 5 is a graph depicting an electric field profile along a straight line between the metal ring and the precursor tip, such as that shown in FIG. 4. As shown in FIG. 5, the electric field profile, in the range of about $10^7$ V/m, is substantially symmetrically distributed around the tip.

FIG. 6 is a schematic two-dimensional depiction of a precursor tip at atomic scale at the initial stages of a process in accordance with an embodiment of the present invention. As shown in FIG. 6, incoming electrons start with low energy at the ring and arrive at the tip shank with high energy. The atoms struck by those electrons become energetic and migrate along the field gradient. The most energetic atoms get evaporated from the apex periphery. The lower energy atoms are not sufficiently delocalized to be evaporated. These less energetic atoms (more tied to the tip surface) migrate towards the apex center which, as noted above, is protected from electron impact by the electric field trajectory of the precursor tip apex. Thus, the very energetic (less bound to the tip surface) atoms migrate along the field gradient and then get evaporated from apex periphery, and the less energetic atoms continue towards the apex center to form the nanotip. Thus, all electrons strike the precursor tip with high energy, but some atoms obtain greater amounts of energy from the electrons, while others obtain lesser amounts of energy. This difference in energy allows the nanoprobe to be formed as desired, to provide an extremely sharp tip, terminating in a single atom.

FIG. 7 is a schematic two-dimensional depiction of a nanotip made in accordance with an embodiment of the present invention. As described above, the sharp atomic tip results from the evaporated atoms lost from the shank in combination with the atoms that migrated and formed the extended built up nanotip protrusion with a single atom at the tip end. The solid curve shown in FIG. 7 represents the initial tip apex shape and position. As clear from the depiction in FIG. 7, atoms have been lost from the shank and some of those lost have migrated to form the extended tip. This feature results from the present invention and would not have been possible from conventional processes for forming nanotips.

As shown in FIG. 7, the sharp atomic tip results from the evaporated atoms from the shank and from the extended built up nano protrusion with a single atom apex. The solid curve represents the initial tip apex shape and position, where the nanotip extends beyond the original apex height.

Figure 8A:
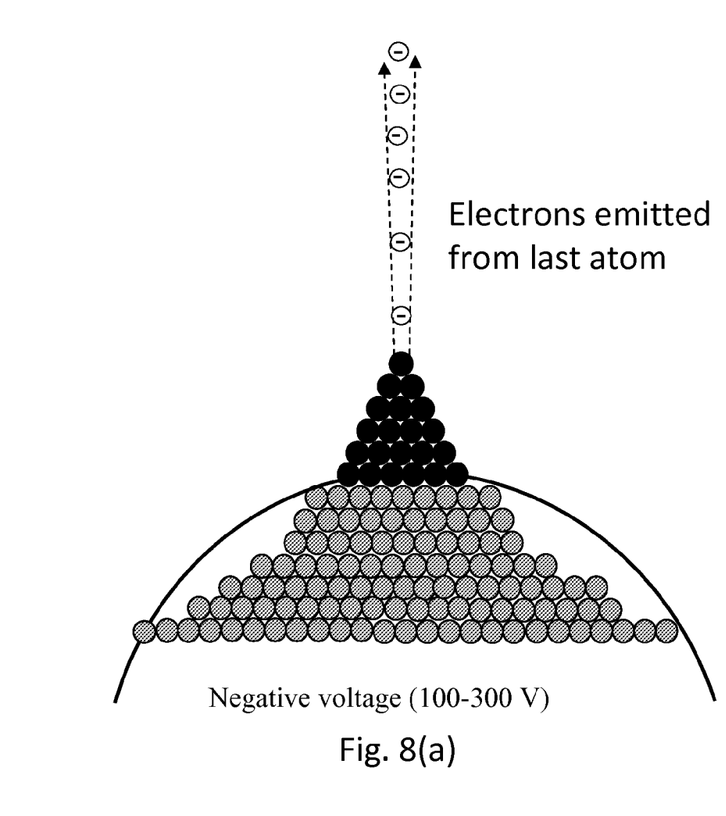
Figure 8B:
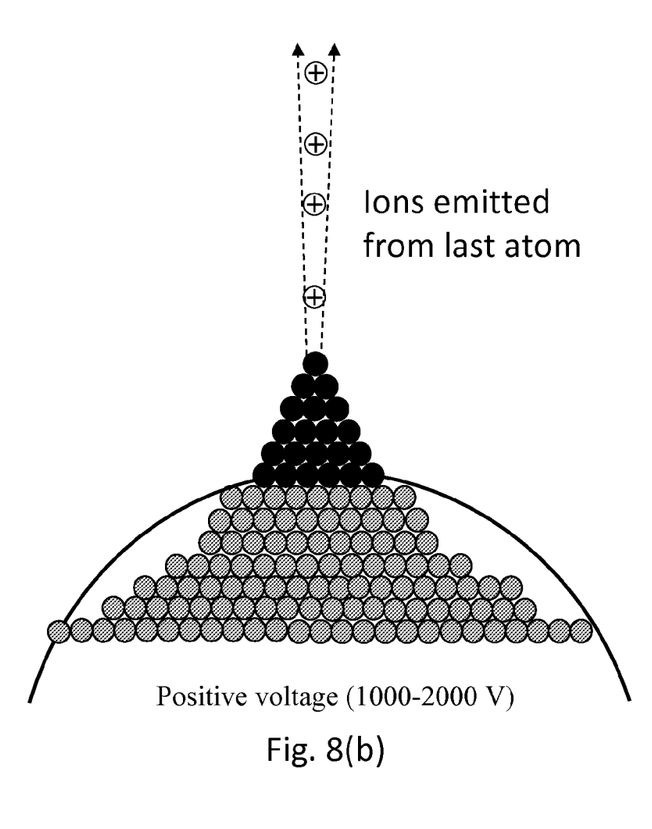

FIGS. 8(a) and (b) are schematic two-dimensional depictions of nanotips made in accordance with embodiments of the present invention shown in exemplary end uses. FIG. 8(a) shows the single atom nanotip used as a super electron source when it is negatively biased in a UHV chamber. FIG. 8(b) shows the single atom nanotip used as a super ion source when it is positively biased in a UHV chamber in the presence of appropriate inert gases or metal ions from the tip itself.

It is noted that, throughout the specification and claims, the numerical limits of the disclosed ranges and ratios may be combined, and are deemed to include all intervening values. Furthermore, all numerical values are deemed to be preceded by the modifier "about", whether or not this term is specifically stated.

While the principles of the invention have been explained in relation to certain particular embodiments, and are provided for purposes of illustration. It is to be understood that various modifications thereof will become apparent to those skilled in the art upon reading the specification. Therefore, it is to be understood that the invention disclosed herein is intended to cover such modifications as fall within the scope of the appended claims. The scope of the invention is limited only by the scope of the claims.

REFERENCES

[1] V. T. Binh, S. T. Purcell, V. Semet and F. Feschet, Appl. Surf. Sci. 130-132 (1998) 803.

[2] H. S. Kuo, I. S. Hwang, T. Y. Fu, J. Y. Wu, C. C. Cheng and T. T. Tsong, Nano Lett. 4 (2004) 2379.
[3] H. W. Fink, IBM J. Res. Develop. 30 (1986) 460.
[4] V. T. Binh and J. Marien, Surf. Sci. Lett. 202 (1988) L539.
[5] M. Rezeq, J. Pitters and R. Wolkow, J. Chem. Phys. 124 (2006) 204716.
[6] Knoblauch, Ch. Wilbertz, Th. Miller and S. Kalbitzer, J. Phys. D: Appl. Phys. 29 (1996) 470.
[7] Moh'd Rezeq, C. Joachim, N. Chandrasekhar, Microelectron. Eng. 86 (2009) 996.
[8] Moh'd Rezeq, Appl. Surf. Sci. (2011), doi:10.106/j.apsusc.2011.10.034, (In press).
[9] S. M. Sze, Kwok K. Ng, "Physics of Semiconductor devices", John Wiley & Sons (2007), ISBN-13:978-0-471-14323-9.

The invention claimed is:

1. A method of fabricating a nano ion electron source comprising:
   placing an assembly of precursor tip with an apex and a shank and a heating metal ring in a field ion microscope chamber;
   placing the metal ring around the precursor tip along the shank at a level below the apex;
   applying a direct current from a current source to the metal ring to heat the ring;
   applying an electrical field to the precursor tip in the field ion microscope;
   wherein the metal ring is exposed to a high electric field from the tip, leading to generation of Schottky field emission of electrons from the metal ring, wherein the applied electrical field is sufficient to cause the electrons to be extracted and accelerated from the metal ring to strike the shank with an energy sufficient to dislodge atoms from the shank; and
   monitoring the evolution of the tip apex due to movement of dislodged atoms from the shank to the apex while adjusting the electrical field and adjusting the voltage and temperature of the metal ring until the apex is sharpened to form a nanotip with a desired apex atomic structure.

2. The method as claimed in claim 1, further comprising applying an electric field to the precursor tip to remove contaminant species and defects prior to connecting the metal ring, around the precursor tip, to the current source.

3. A method as claimed in claim 2 wherein a positive voltage is gradually applied to the tip of the wire to remove oxide layers and other contaminants and defects.

4. The method as claimed in claim 1 wherein the precursor tip is made of a metal or a semiconductor.

5. The method as claimed in claim 4 wherein the metal comprises tungsten, niobium, molybdenum, tantalum, rhenium, osmium, iridium, palladium, gold and other metals or an alloy of two or more thereof.

6. The method as claimed in claim 4 wherein the precursor tip comprises an electrochemically etched polycrystalline or single crystal wire.

7. The method as claimed in claim 1 wherein the vacuum chamber is an ultra high vacuum chamber.

8. The method as claimed in claim 1 wherein the metal ring comprises a refractory metal.

9. The method as claimed in claim 8 wherein the refractory metal comprises tungsten, niobium, molybdenum, tantalum, rhenium, osmium, iridium, or an alloy of two or more thereof.

10. The method as claimed in claim 1 wherein the metal ring is about 2-4 mm in diameter.

11. The method as claimed in claim 1 wherein the metal ring is placed behind the precursor tip apex by about 1 mm or more.

12. The method as claimed in claim 1 wherein the electric field on the precursor tip is generated by applying an electric voltage from 5 to 20 kV.

13. The method as claimed in claim 1 wherein the temperature of the metal ring is about 1800 K and is obtained by applying a direct current through the ring.

14. The method as claimed in claim 1 wherein the electric field on the ring results from the voltage applied to the precursor tip and ground on the ring.

15. The method as claimed in claim 1 wherein the electric field on the apex of the precursor tip is directed toward a screen in the field ion microscope and the electric field on the shank of the precursor tip is directed toward the metal ring.

16. The method as claimed in claim 1 wherein the electric field on the ring is sufficient to generate Schottky field emission of electrons from the hot metal ring.

17. The method as claimed in claim 1 wherein a voltage difference between the precursor tip and the metal ring is sufficient to cause the electrons to be accelerated from the metal ring to strike the shank with an energy of about 10 keV or more, thereby to dislodge atoms from the tip shank.

18. The method as claimed in claim 1 wherein dislodged atoms migrate and evaporate from the shank to sharpen the tip and/or reduce the tip base.

19. The method as claimed in claim 18 wherein the nanotip has a length that exceeds the length of the precursor tip.

20. The method as claimed in claim 1 wherein atoms migrate to the apex and extend the apex to increase its length and sharpness.

21. The method as claimed in claim 1 wherein the nanotip with the desired apex atomic structure is formed due to field evaporation of highly energetic atoms from a periphery of the apex and due to buildup of a sharp extension of less energetic atoms that migrate to the apex.

22. The method as claimed in claim 1 wherein the field ion microscope chamber is free of etchant gases.

23. The method as claimed in claim 1 wherein the precursor tip is a damaged nanotip and the method restores the nanotip to the desired apex atomic structure.

* * * * *

UNITED STATES PATENT AND TRADEMARK OFFICE
CERTIFICATE OF CORRECTION

PATENT NO. : 8,460,049 B2
APPLICATION NO. : 13/293167
DATED : June 11, 2013
INVENTOR(S) : Moh'd Rezeq Page 1 of 1

It is certified that error appears in the above-identified patent and that said Letters Patent is hereby corrected as shown below:

Title page, Item [73] Assignee should read -- "Khalifa University of Science, Technology & Research (KUSTAR), Abu Dhabi (AE)".

Signed and Sealed this
Fifteenth Day of October, 2013

Teresa Stanek Rea
*Deputy Director of the United States Patent and Trademark Office*